United States Patent [19] — [11] 4,139,075

Kobayashi et al. — [45] Feb. 13, 1979

[54] LOUDSPEAKER DEVICE

[75] Inventors: Fumio Kobayashi; Nobuaki Ban, both of Tokyo, Japan

[73] Assignee: Sansui Electric Co., Ltd., Tokyo, Japan

[21] Appl. No.: 827,558

[22] Filed: Aug. 25, 1977

[30] Foreign Application Priority Data

Aug. 31, 1976 [JP] Japan .......................... 51/116877[U]

[51] Int. Cl.[2] ......................... H05K 5/00; G10K 13/00

[52] U.S. Cl. .................................... 181/148; 181/156; 181/151; 181/163

[58] Field of Search ............... 181/156, 163, 144, 146, 181/148, 151, 154, 199

[56] References Cited

U.S. PATENT DOCUMENTS

| | | | |
|---|---|---|---|
| 2,713,396 | 7/1955 | Tavares | 181/199 |
| 3,037,081 | 5/1962 | Carlsson | 181/148 |
| 3,101,810 | 8/1963 | Doschek | 181/199 |
| 3,412,824 | 11/1968 | Armstrong | 181/151 |
| 3,780,824 | 12/1973 | Prince | 181/148 |

*Primary Examiner*—Stephen J. Tomsky
*Attorney, Agent, or Firm*—Harris, Kern, Wallen & Tinsley

[57] ABSTRACT

A loudspeaker device comprises a bass reflexing duct formed on an enclosure on which the loudspeaker unit is provided, a passive radiator provided on the enclosure; an acoustic impedance body provided between at least one of the duct and passive radiator and the loudspeaker unit, so that the resonance frequencies of the duct and the passive radiator are different from each other thereby to markedly improve the low acoustic compass characteristic thereof.

3 Claims, 2 Drawing Figures

LOUDSPEAKER DEVICE

BACKGROUND OF THE INVENTION

This invention relates to loudspeaker devices having an improved low acoustic response characteristic.

In general, well known in the art as means of improving the low acoustic compass characteristics of a loudspeaker device are a bass reflex system in which a duct is formed on the baffle board of an enclosure, or a cabinet, and the low acoustic compass is intensified by the utilization of the resonance of the duct due to the back pressure of the loudspeaker unit, and a passive radiator system in which a diaphragm having a driving source is employed instead of the duct in the bass reflex system, the diaphragm being in resonance by the back pressure of the above-described loudspeaker unit so as to be operate as a passive radiator.

In either of these systems, the resonance operation is effective within a limited frequence range. Therefore, it is impossible to sufficiently increase the frequence range. In addition, since the resonance characteristics of these systems are different, it is difficult for these systems to provide desired reproduction characteristics.

SUMMARY OF THE INVENTION

Accordingly, an object of this invention is to overcome the above-described difficulties accompanying a conventional loudspeaker device.

More specifically, an object of the invention is to provide a loudspeaker device in which the specific features of the bass reflex system and the passive radiator system are effective combined to provide desired reproduction characteristics thereby to remarkably improve the low acoustic compass characteristics.

The foregoing object and other objects of this invention have been achieved by the provision of a loudspeaker device comprising: a loudspeaker unit; an enclosure on which the loudspeaker unit is provided; a bass reflexing duct formed on the enclosure; a passive radiator provided on the enclosure; and an acoustic impedance body provided between the loudspeaker unit and at least one of the duct and passive radiator, so that the duct and the passive radiator are in resonance at different frequencies.

The nature, utitlity, and principle of the invention will become more apparent from the following detailed description and the appended claim when read in conjunction with the accompanying drawing.

DETAILED DESCRIPTION OF THE INVENTION

Figure 1:
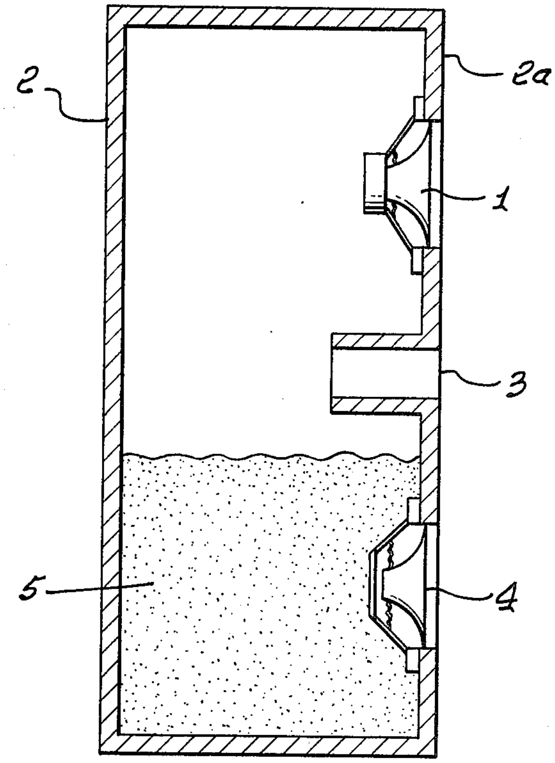
FIG. 1 is a sectional view of a loudspeaker device incorporating an embodiment of the present invention.

One preferred embodiment of this invention will be described with reference to FIG. 1 in the accompanying drawing, which comprises a loudspeaker unit 1 of one way full range type which is mounted on the front baffle 2*a* of an enclosure 2. The front baffle 2*a* of the enclosure 2 is provided with a bass reflexing duct 3 below the loudspeaker unit 1 and a passive radiator 4 below the duct 3. The inside of the enclosure 2 below the duct 3 and behind the passive radiator 4 is filled with sound absorbing material such as glass wool or permeable sponge as an acoustic inpedance body 5. In this case, the passive radiator 4 is tuned to a certain frequency by selectively employing compliance relating to edge effects and damper effects and the mass of a conical diaphragm (or the weight of and additional mass member for adding a mass to the conical diaphragm), and the dimensions and shape of the duct 3 is so designed that the duct 3 is in resonance at a frequency slightly higher than the resonant frequency of the passive radiator 4.

In the loudspeaker device thus constructed, the acoustic wave produced behind the loudspeaker unit 1, namely, the back pressure of the loudspeaker unit 1 is imparted through the inside of the enclosure 2 to the duct 3, the passive radiator 4, and the acoustic impedance body 5. In other words, the back pressure of the loudspeaker unit 1 is applied to the passive radiator 4 through the acoustic impedance body 5. In this connection, since the acoustic impedance body 5 is provided in the enclosure, if the material and quantity thereof is so selected that its sound transmission characteristics are suitable, then it is possible to absorb or cut off the frequency component in relatively high compass of the back pressure of the loudspeaker unit 1 thereby to apply only the low compass component close to the resonance frequency of the passive radiator 4 to the passive radiator 4. In addition, if the mutual relationship between the duct 3 and the acoustic impedance body 5 are determined so that the duct 3 is in resonance at a frequency which is difficult to pass through the acoustic impedance body 5, simultaneously with the resonance operation of the passive radiator 4 the resonance operation of the duct 3 is effected in a frequency band slightly higher than the resonant frequency of the passive radiator 4.

Thus, the frequency response characteristics of the loudspeaker device can be improved over a wide frequency band in a low acoustic compass as desired. In addition, the provision of the acoustic impedance body 5 contributes to the effective prevention of the echo, in the passive radiator 4, which is caused by the back pressure of the loudspeaker unit 1, and also unnecessary operations, other than the required resonance operations, of the passive radiator 4 and the duct 3. In other words, the provision of the acoustic impedance body 5 serves to minimize the distortion which may be mixed into the reproduced sound.

As is apparent from the above description, according to this invention, the specific features of the bass reflex system and the passive radiator system are effectively combined to provide the desired reproduction characteristics, which leads to the provision of a loudspeaker device whose low acoustic compass is remarkably improved.

Figure 2:
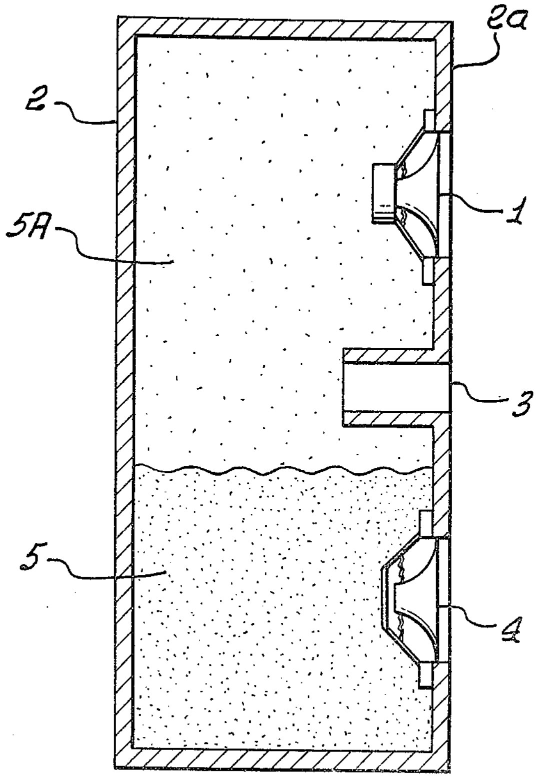
FIG. 2 is a view similar to FIG. 1 of an alternative embodiment.

While one preferred embodiment of the invention has been illustrated and described in detail, it is particularly understood that the invention is not limited thereto or thereby, and various changes and modifications may be made therein without departing the spirit and scope of the invention. The loudspeaker device with the loudspeaker unit of one-way full range type has been described above. However, the technical concept of this invention can be also applied to a loudspeaker device of two or more way type with a woofer or a super woofer, similarly as in the above-described loudspeaker device. In addition, the relationship between the duct 3 and the passive radiator 4 may be reversed. Furthermore, in an alternative embodiment as shown in FIG. 2, the inside of the enclosure may be in its entirety filled with the acoustic impedance bodies 5 and 5A, if the material density in necessary portions thereof is changed as required.

What is claimed is:

1. A loudspeaker device comprising:

a loudspeaker unit;

an enclosure on which said loudspeaker unit is provided;

a bass reflexing duct formed on said enclosure and defining a first acoustic path through said enclosure between said loudspeaker unit and said duct;

a passive radiator provided on said enclosure and defining a second acoustic path through said enclosure between said loudspeaker unit and said radiator, with said second path diverging from said first path; and an acoustic impedance body provided in said second path between said passive radiator and said loudspeaker unit so that said duct and said passive radiator are in resonance at different frequencies.

2. A loudspeaker device as claimed in claim 1, wherein the resonance frequency of said passive radiator is lower than that of said duct.

3. A loudspeaker device as claimed in claim 2, further comprising another acoustic impedance body provided in said first path between said loudspeaker unit and said duct.

* * * * *